United States Patent
Prejbeanu et al.

(10) Patent No.: US 8,971,102 B2
(45) Date of Patent: Mar. 3, 2015

(54) MRAM CELL AND METHOD FOR WRITING TO THE MRAM CELL USING A THERMALLY ASSISTED WRITE OPERATION WITH A REDUCED FIELD CURRENT

(71) Applicant: CROCUS Technology SA, Grenoble Cedex (FR)

(72) Inventors: Ioan Lucian Prejbeanu, Seyssinet Pariset (FR); Ricardo Sousa, Grenoble (FR)

(73) Assignee: CROCUS Technology SA, Grenole (FR)

( * ) Notice: Subject to any disclaimer, the term of this patent is extended or adjusted under 35 U.S.C. 154(b) by 0 days.

(21) Appl. No.: 13/739,044

(22) Filed: Jan. 11, 2013

(65) Prior Publication Data
US 2013/0182499 A1 Jul. 18, 2013

(30) Foreign Application Priority Data
Jan. 16, 2012 (EP) .................................. 12290019

(51) Int. Cl.
*G11C 11/00* (2006.01)
*G11C 11/16* (2006.01)
(52) U.S. Cl.
CPC ............ *G11C 11/1675* (2013.01); *G11C 11/16* (2013.01)
USPC .......................................... 365/158; 365/148
(58) Field of Classification Search
CPC ............................ G11C 11/16; G11C 11/5607
USPC ................................................. 365/158, 148
See application file for complete search history.

(56) References Cited

U.S. PATENT DOCUMENTS

2011/0007561 A1* 1/2011 Berger et al. .................. 365/171
2012/0155159 A1* 6/2012 Prejbeanu ..................... 365/158

FOREIGN PATENT DOCUMENTS

EP 2221826 A1 8/2010
EP 2276034 A2 1/2011

OTHER PUBLICATIONS

Extended European Search Report for EP/12290019.4 dated Jul. 20, 2012.

* cited by examiner

*Primary Examiner* — Anthan Tran
(74) *Attorney, Agent, or Firm* — Pearne & Gordon LLP

(57) ABSTRACT

The present disclosure concerns a method for writing to a MRAM cell comprising a magnetic tunnel junction formed from a storage layer having a storage magnetization; a reference layer having a reference magnetization; and a tunnel barrier layer included between the sense and storage layers; and a current line electrically connected to said magnetic tunnel junction; the method comprising: passing a heating current in the magnetic tunnel junction for heating the magnetic tunnel junction; passing a field current for switching the storage magnetization in a written direction in accordance with the polarity of the field current. The magnitude of the heating current is such that it acts as a spin polarized current and can adjust the storage magnetization; and the polarity of the heating current is such as to adjust the storage magnetization substantially towards said written direction.

6 Claims, 3 Drawing Sheets

(a) (b)

MRAM CELL AND METHOD FOR WRITING TO THE MRAM CELL USING A THERMALLY ASSISTED WRITE OPERATION WITH A REDUCED FIELD CURRENT

FIELD

The present disclosure concerns a random access memory (MRAM) cell and a method for writing to the MRAM cell using a thermally assisted write operation with a reduced field current.

BACKGROUND

Random access memory (MRAM) cells using a thermally assisted write operation usually comprise a magnetic tunnel junction formed from a reference layer having a fixed magnetization, a storage layer having a magnetization that can be switched and a tunnel barrier between the reference and storage layers. The MRAM cell further comprises an antiferromagnetic layer exchange-coupling the magnetization of the storage layer. Such MRAM cells are characterized by a considerably improved thermal stability of the storage layer due to the exchange-coupling of the antiferromagnetic layer. An improved writing selectivity of such MRAM cells is also achieved due to the selective heating of the memory cell to be written in comparison with the neighboring memory cells remaining at ambient temperature. The MRAM cell is written using a field current passing in a field line such as to generate a magnetic field adapted to switch the magnetization of the storage layer when the memory cell is heated. The magnitude of the field current can be however too high for low power applications.

SUMMARY

The present disclosure concerns a method for writing to a MRAM cell comprising: a magnetic tunnel junction comprising a storage layer having a storage magnetization that can be adjusted when the magnetic tunnel junction is heated to a high temperature threshold and fixed when the magnetic tunnel junction is cooled to a low temperature threshold; a reference layer having a fixed reference magnetization; and a tunnel barrier layer included between the sense and storage layers; and a current line electrically connected to said magnetic tunnel junction; the method comprising:

passing a heating current in the magnetic tunnel junction via the current line for heating the magnetic tunnel junction;

once magnetic tunnel junction has reached the high temperature threshold, passing a field current such as to switch the storage magnetization in a written direction substantially parallel or antiparallel relative to the reference magnetization, in accordance with the polarity of the field current;

the magnitude of the heating current is such that it acts as a spin polarized current and exerts an adjusting spin transfer on the storage magnetization;

the polarity of the heating current being such as to adjust the storage magnetization substantially towards said written direction.

In an embodiment, the MRAM cell can further comprise a bipolar transistor in electrical connection with one end of the magnetic tunnel junction, the bipolar transistor being arranged for controlling the passing of the heating current in the magnetic tunnel junction and the polarity of the heating current.

In another embodiment, the field current can be passed in the current line. Alternatively, the MRAM cell can comprise a field line, and the field current can be passed in the field line.

In yet another embodiment, the MRAM cell can further comprise a storage antiferromagnetic layer exchange coupling the storage layer and pinning the storage magnetization when the magnetic tunnel junction is at the low temperature threshold and freeing the storage magnetization when the magnetic tunnel junction is at the high temperature threshold.

The MRAM cell and the method for writing to the MRAM cell disclosed herein allows for combining the heating current acting as a spin polarized current at the high current threshold, with the field current for switching the storage magnetization. The field current used for switching the storage magnetization can be reduced compared to a conventional MRAM cell.

BRIEF DESCRIPTION OF THE DRAWINGS

The invention will be better understood with the aid of the description of an embodiment given by way of example and illustrated by the figures, in which.

DETAILED DESCRIPTION OF POSSIBLE EMBODIMENTS

Figure 1:
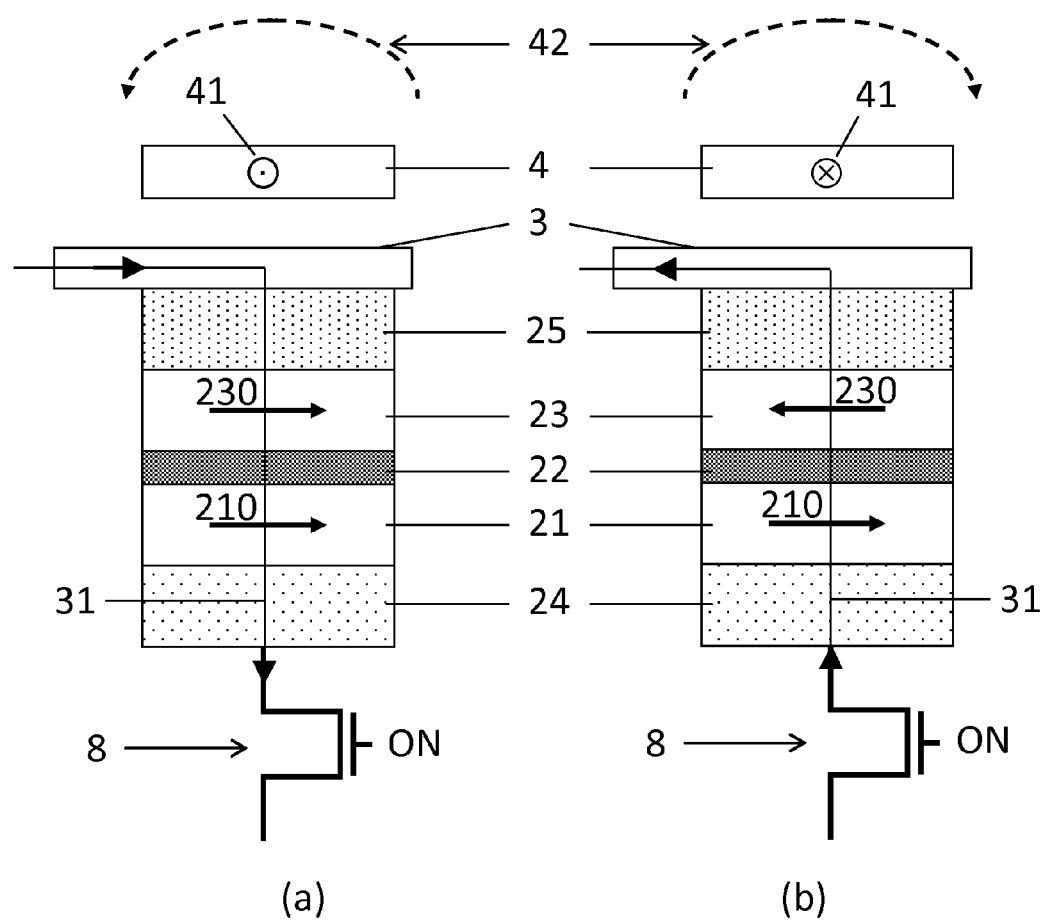
FIG. 1 shows a view of a random access memory (MRAM) cell comprising a magnetic tunnel junction, a select transistor, a current line for passing a heating current, and a field line for passing a field current, according to an embodiment.

FIG. 1 shows a random access memory (MRAM) cell 1 according to an embodiment. The MRAM cell 1 comprises a storage layer 23 having a storage magnetization 230 that can be adjusted when the magnetic tunnel junction 2 is heated to a high temperature threshold and fixed when the magnetic tunnel junction 2 is cooled to a low temperature threshold. The magnetic tunnel junction 2 further comprises a reference layer 21 having a fixed reference magnetization 210, and a tunnel barrier layer 22 included between the sense and storage layers 21, 23. The MRAM further comprises a current line 3 electrically connected to one end of the magnetic tunnel junction 2 arranged to pass a heating current 31. The MRAM can further comprise a select transistor 8 electrically connected to the other end of the magnetic tunnel junction 2. A control current line, or word line (not represented), can be used to control the opening and the closing of the select transistor 8 in order to address the MRAM cell 1 individually. The select transistor 8, for example, can comprise a CMOS transistor. In the example of FIG. 1, the MRAM cell 1 further comprises a field line 4 arranged at said one end of the magnetic tunnel junction 2 and substantially perpendicular to the current line 3 and adapted for passing a field current 41. In FIG. 1, the field line and the field current 41 are represented perpendicular to the page.

In an embodiment, a write operation for writing to the MRAM cell 1 comprises:

passing the heating current 31 in the magnetic tunnel junction 2 via the current line 3 for heating the magnetic tunnel junction 2;

once magnetic tunnel junction 2 has reached the high temperature threshold, passing the field current 41 such as to switch the storage magnetization 230 in a written direction;

cooling the magnetic tunnel junction 2 to the low temperature threshold such as to pin the storage magnetization 230 in the written direction.

The field current 41 can be passed in the field line 4 such as to generate a write magnetic field 42 having a direction that depends on the sense, or polarity, of the field current 41. In FIG. 1(*a*), the field current 41 is shown with a first field current polarity, here entering the page, such that the write magnetic field 42 switches the storage magnetization 230 in the written direction that is substantially parallel to the reference magnetization 210. The parallel arrangement between the storage magnetization 230 and the reference magnetization 210 yields a low junction resistance R (or level state "0"). In FIG. 1(*b*), the field current 41 is shown with a second field current polarity, here exiting the page, such that the write magnetic field 42 switches the storage magnetization 230 in the written direction that is substantially antiparallel to the reference magnetization 210. The antiparallel arrangement between the storage magnetization 230 and the reference magnetization 210 yields a high junction resistance R (or level state "1").

Passing the heating current 31 in the magnetic tunnel junction 2 can be achieved by setting the select transistor 8 in its conducting mode (ON). When the magnetic tunnel junction 2 has reached the high temperature threshold, the storage magnetization 230 can be freely aligned and thus switched in the write magnetic field 42. The heating current 31 can then be turned off by setting the select transistor 8 in the cutoff mode (OFF) and/or by removing the transistor's source-drain bias. The field current 41 can be maintained during the cooling of the magnetic tunnel junction 2, and then switched off, when the magnetic tunnel junction 2 has reached the low temperature threshold wherein the storage magnetization 230 is frozen in the written state.

In an embodiment, the magnetic tunnel junction 2 comprises a antiferromagnetic reference layer 24 exchange-coupling the reference layer 21 such as to pin the reference magnetization 210 below a reference critical temperature $T_{C1}$ of the antiferromagnetic reference layer 24. The magnetic tunnel junction 2 can further comprise a antiferromagnetic storage layer (show in FIG. 1 by numeral 25) having a storage critical temperature $T_{C2}$ and exchange-coupling the storage layer 23. The storage antiferromagnetic layer is arranged to pin the storage magnetization 230 at the low temperature threshold, below the storage critical temperature $T_{C2}$, and to free the storage magnetization 230 at the high temperature threshold, at or above the storage critical temperature $T_{C2}$. The storage critical temperature $T_{C2}$ should be lower than the reference critical temperature $T_{C1}$ such that, at the high temperature threshold, the reference magnetization 210 remains pinned by the antiferromagnetic reference layer 24.

The magnitude of the heating current 31 required for heating the magnetic tunnel junction at the high temperature threshold is typically below the magnitude needed for obtaining a spin transfer torque (STT) effect. In the case the reference critical temperature $T_{C1}$ of the antiferromagnetic reference layer 24 is high enough, the magnitude of the heating current 31 required to heat the magnetic tunnel junction to the high temperature threshold can be such that the heating current 31 generates the STT effect. The STT effect so generated can be such as to orient the storage magnetization 230 in a direction that is different than the one of the write magnetic field 42 during the write operation. The STT effect can thus produce unwanted effects on the applied write magnetic field 42, such as write magnetic field asymmetry, broadening of the write magnetic field distribution, or even writing errors.

In an embodiment, the heating current 31 is passed with a magnitude corresponding to a high current threshold that is sufficient for the heating current 31 to act as a spin polarized current. The heating current 31 becomes polarized when passing through the reference layer 21 or through a possible polarizing layer (not shown), according to the flow direction, or polarity, of the heating current 31. At the current threshold, the storage magnetization 230 can then be adjusted by transfer of the angular spin moment between the spin-polarized carriers (electrons) of the heating current 31 and the storage magnetization 230. This transfer of the angular spin is also known under the expression "spin transfer torque (STT)".

According to the polarity of the heating current 31, the spins of the electrons penetrating into the storage layer 23 are in majority oriented along the reference magnetization 210 or a magnetization of the possible polarizing layer. More particularly, the polarity of the heating current 31 can be selected such as to exerts an adjusting spin transfer on the storage magnetization 230 substantially in the written direction, i.e., such that the heating current 31 adjusts the storage magnetization 230 substantially in the same direction as the direction the write magnetic field 42 switches the storage magnetization 230. This is illustrated in FIG. 1 where FIG. 1(*a*) shows the heating current 31 having a first heating current polarity, here flowing from the current line 3 towards the select transistor 8, such as to align the storage magnetization 230 in the same direction (written direction) as the one provided by the write magnetic field 42 generated by the field current 41 having the first field current polarity. In FIG. 1(*b*), the heating current 31 is represented having a second heating current polarity opposite to the first heating current polarity, here flowing from the select transistor 8 towards the current line 3, such as to align the storage magnetization 230 in the same direction (written direction) as the one provided by the write magnetic field 42 generated by the field current 41 having the second field current polarity. In contrast with conventional MRAM cells using a monopolar select transistor, the select transistor 8 is bipolar allowing for changing the polarity of the heating current 31.

Figure 4:
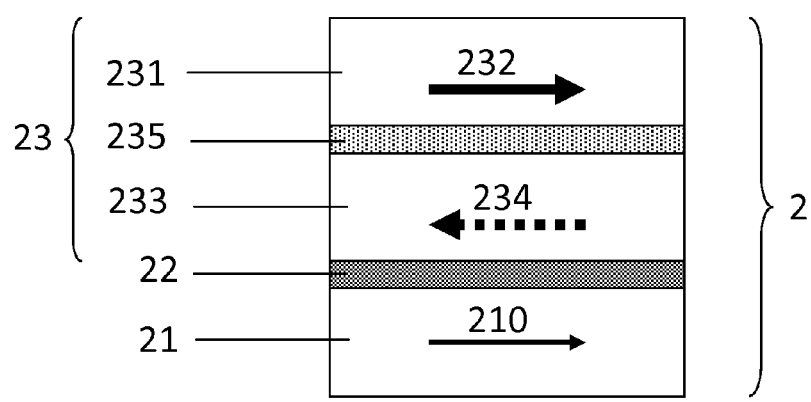
FIG. 4 represents the magnetic tunnel junction comprising a synthetic storage layer, according to an embodiment.

In yet another embodiment, the storage layer 23 can be a synthetic storage layer comprising a first ferromagnetic layer 231 on the side of the tunnel barrier layer 22 and having a first ferromagnetic magnetization 232, a second ferromagnetic layer 233 having a second ferromagnetic magnetization 234, and a non-magnetic coupling layer 235 separating the first and second ferromagnetic layers 231, 233. The magnetic tunnel junction 2 comprising such a synthetic storage layer 23 is represented in FIG. 4. Passing a field current 41 switches the first and second ferromagnetic magnetization 232, 234 relative to the reference magnetization 210, such that the first storage magnetization 232 is in the written direction. The storage magnetization (not shown in FIG. 4) corresponds to the vectorial sum of the first and second ferromagnetic magnetizations 232, 234.

Figure 2:
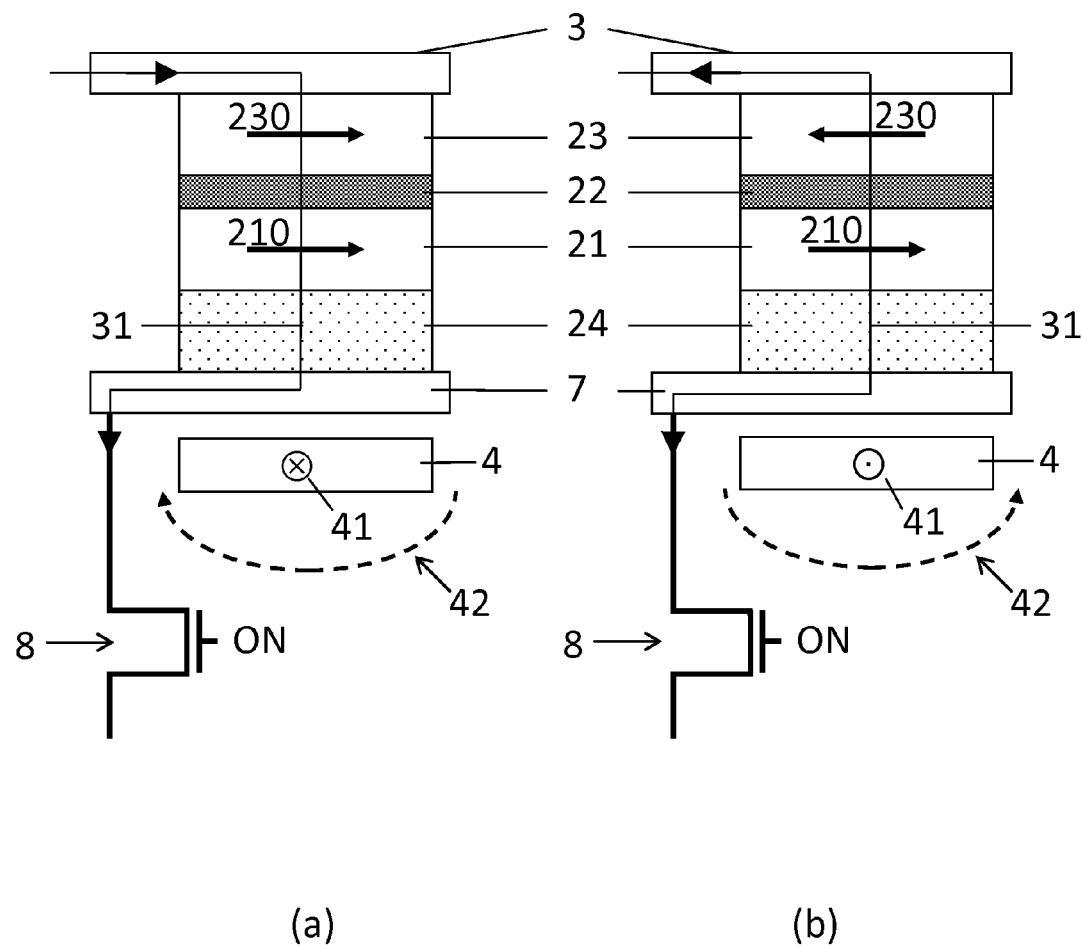
FIG. 2 illustrates the MRAM cell according to another embodiment.

FIG. 2 shows the MRAM cell 1 according to another embodiment. The MRAM cell 1 of FIG. 2 is substantially the same as the one represented in FIG. 1 but having the field line 4 being arranged at said other end of the magnetic tunnel junction 2, i.e., on the side of the select transistor 8. Although not shown in FIG. 2, the magnetic tunnel junction 2 can also comprise the antiferromagnetic storage layer described in the example of FIG. 1. In the configuration of FIG. 2, the select transistor 8 is electrically connected to the other end of the magnetic tunnel junction 2 via a conductive strap 7. FIG. 2(*a*) shows the field current 41 passing in the field line 4 with the first field current polarity and the heating current 31 having the first heating current polarity. Both the field current 41 and the heating current 31 aligning the storage magnetization 230 in the written direction, here in the written level state "0". FIG. 2(*b*) shows the field current 41 passing in the field line 4 with the second field current polarity and the heating current 31 having the second heating current polarity. Both the field current 41 and the heating current 31 aligning the storage magnetization 230 in the written direction, here in the written level state "1".

Figure 3:
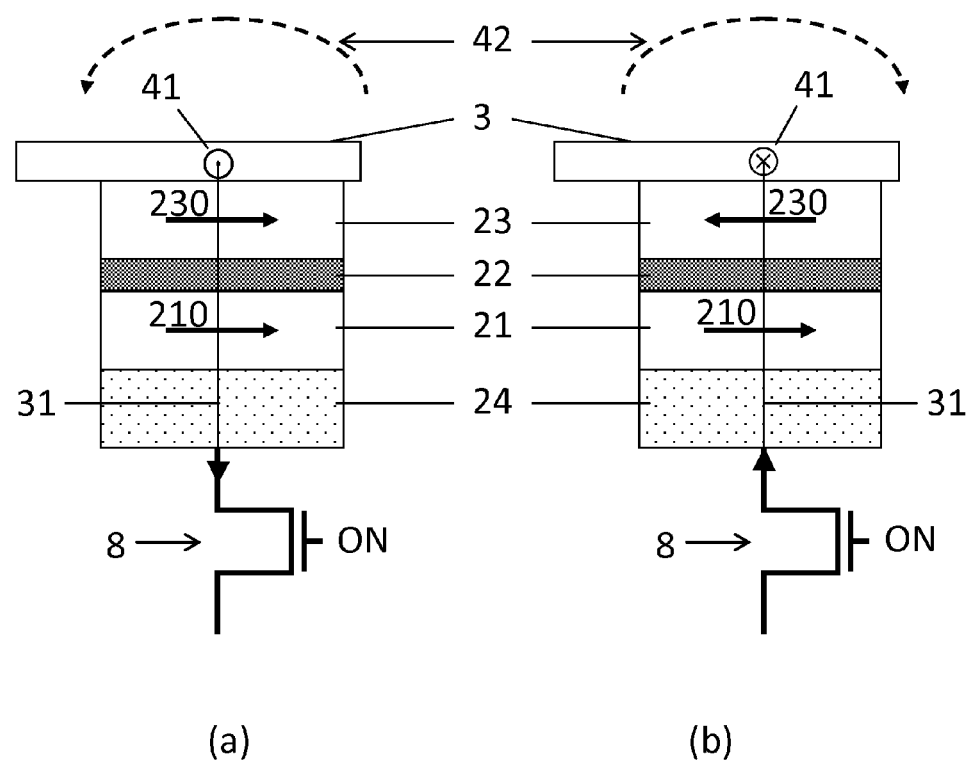
FIG. 3 illustrates the MRAM cell according to another embodiment, wherein the heating current and the field current are passing in the current line.

FIG. 3 shows the MRAM cell 1 according to yet another embodiment, wherein the MRAM cell 1 only comprises the current line 3 for passing the heating current 31 and the field current 41. Although not shown in FIG. 3, the magnetic tunnel junction 2 can also comprise the antiferromagnetic storage layer described in the example of FIG. 1. FIGS. 3(*a*) and 3(*b*) show both the field current 41 and the heating current 31 passing in the current line 3. In FIG. 3(*a*), the field current 41 flows with the first field current polarity and the heating current 31 flows with the first heating current polarity, such as to align the storage magnetization 230 in the written direction, here in the written level state "0". In FIG. 3(*b*), the field current 41 flows with the second field current polarity and the heating current 31 flows with the second heating current polarity, such as to align the storage magnetization 230 in the written direction, here in the written level state "1". In the configuration of FIG. 3, the current line 3 fulfills the function of a bit line by passing the heating current 31 and of a field line by passing the field current 41.

The method disclosed herein allows for combining the heating current acting as a spin polarized current at the high current threshold, with the field current 41 for switching the storage magnetization 230. In other words, when the heating current is passed at the high current threshold and with a suitable polarity, it can assist the magnetic field 42 generated by the field current 41 in switching the storage magnetization 230. An advantage of passing the heating current acting at the high current threshold is that the write magnetic field 42, and thus the field current 41, can be reduced compared to a conventional MRAM cell.

A magnetic memory device (not shown) can be formed by assembling an array comprising a plurality of the MRAM cell 1. The array of MRAM cells 1 can be disposed within a device package (not shown). When forming the magnetic memory device, the magnetic tunnel junction 2 of each MRAM cell 1 can be connected on the side of the storage layer 23 to the current line 3 and on the opposite side to the word line (not shown). The word line is preferably placed perpendicularly with reference to the current line 3.

REFERENCE NUMBERS 1 magnetic random access memory (MRAM) cell
2 magnetic tunnel junction
21 reference layer
210 reference magnetization
22 tunnel barrier layer
23 storage layer
230 storage magnetization
231 first ferromagnetic layer
232 first ferromagnetic magnetization
233 second ferromagnetic layer
234 second ferromagnetic magnetization
235 non-magnetic coupling layer
24 antiferromagnetic reference layer
25 antiferromagnetic storage layer
3 current line
31 heating current
4 field line
41 field current
42 write magnetic field
7 strap
8 select transistor

The invention claimed is:

1. Method for writing to a random access memory (MRAM) cell using a thermally assisted write operation, the MRAM cell comprising:
   a magnetic tunnel junction comprising a storage layer having a storage magnetization that can be adjusted when the magnetic tunnel junction is heated to a high temperature threshold and fixed when the magnetic tunnel junction is cooled to a low temperature threshold; a reference layer having a fixed reference magnetization; and a tunnel barrier layer included between the sense and storage layers; and
   a current line electrically connected to said magnetic tunnel junction;
   the method comprising:
   passing a heating current in the magnetic tunnel junction via the current line for heating the magnetic tunnel junction;
   once magnetic tunnel junction has reached the high temperature threshold, passing a field current which generates a write magnetic field which switches the storage magnetization in a written direction substantially parallel or antiparallel relative to the reference magnetization, in accordance with the polarity of the field current;
   the magnitude of the heating current being such that it acts as a spin polarized current and exerts an adjusting spin transfer on the storage magnetization; and
   the polarity of the heating current being such as to exert an adjusting spin transfer on the storage magnetization substantially towards said written direction.

2. Method according to claim 1, wherein the MRAM cell further comprises a bipolar transistor in electrical connection with one end of the magnetic tunnel junction, the bipolar transistor being arranged for controlling the passing of the heating current in the magnetic tunnel junction and the polarity of the heating current.

3. Method according to claim 1, wherein the field current is passed in the current line.

4. Method according to claim 1, wherein the MRAM cell further comprises a field line and wherein the field current is passed in the field line.

5. Method according to claim 1, wherein the MRAM cell further comprises a storage antiferromagnetic layer exchange coupling the storage layer and pinning the storage magnetization when the magnetic tunnel junction is at the low temperature threshold and freeing the storage magnetization when the magnetic tunnel junction is at the high temperature threshold.

6. Method according to claim 1, wherein the storage layer comprises a first ferromagnetic layer on the side of the tunnel barrier layer and having a first ferromagnetic magnetization, a second ferromagnetic layer having a second ferromagnetic magnetization, and a non-magnetic coupling layer separating the first and second ferromagnetic layers, and wherein said passing a field current switches the first and second ferromagnetic magnetization relative to the reference magnetization, such that the first storage magnetization is in the written direction.

* * * * *